(12) United States Patent
Barkley et al.

(10) Patent No.: US 7,518,932 B2
(45) Date of Patent: Apr. 14, 2009

(54) ERASE CYCLE COUNTING IN NON-VOLATILE MEMORIES

(75) Inventors: Gerald Barkley, Oregon, WI (US); John Rudelic, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/644,622

(22) Filed: Dec. 22, 2006

(65) Prior Publication Data
US 2008/0155181 A1      Jun. 26, 2008

(51) Int. Cl.
*G11C 11/34* (2006.01)
(52) U.S. Cl. .............................. 365/185.29; 365/185.33
(58) Field of Classification Search ............ 365/185.29, 365/185.33
See application file for complete search history.

(56) References Cited

U.S. PATENT DOCUMENTS

| | | | | |
|---|---|---|---|---|
| 5,513,136 A | * | 4/1996 | Fandrich et al. | 365/185.04 |
| 6,202,138 B1 | * | 3/2001 | Estakhri et al. | 711/168 |
| 6,262,916 B1 | * | 7/2001 | Kuriyama et al. | 365/185.24 |
| 6,580,638 B2 | * | 6/2003 | Conley et al. | 365/185.11 |
| 6,594,183 B1 | * | 7/2003 | Lofgren et al. | 365/185.33 |
| 7,092,297 B1 | * | 8/2006 | Torii | 365/185.29 |
| 2006/0023510 A1 | * | 2/2006 | Watanabe | 365/185.11 |

* cited by examiner

*Primary Examiner*—Michael T Tran
(74) *Attorney, Agent, or Firm*—Trop, Pruner & Hu, P.C.

(57) ABSTRACT

Erase cycle counting may be used for a non-volatile memory to balance the cycles on memory blocks or partitions. In some embodiments, the non-volatile memory may include two memory locations such as wordlines associated with each block of memory. The wordlines may be alternately erased so that an updated cycle count is transferred from the wordlines to the other. In the case of a power loss in the course of the updating of the cycle count, a method may detect that the data is in improper states and require that the erase be restarted after the power loss in order to recover the correct erase cycle count.

26 Claims, 6 Drawing Sheets

ERASE CYCLE COUNTING IN NON-VOLATILE MEMORIES

BACKGROUND

This relates generally to memory devices and, more specifically, to non-volatile memory devices.

Memory devices store digital information. As technology advances, memory devices are able store increasingly large amounts of information. Historically, information density in memories has increased through reductions in device sizes and increases in integration. Information density may also be increased by storing more than one bit of information in each memory "cell."

DETAILED DESCRIPTION

A non-volatile memory is typically divided into partitions or blocks, where each block contains a group of memory cells. In the programming and erasing of cells in a block, internal software may not have a method to track which partitions have been cycled more than others. There is a potential risk that one partition may be cycled more than another partition and, as a result, the lifetime of the memory may decrease. A cycle counter reduces the risk of this occurrence. By implementing cycle counter rows in each block, internal software can determine which partitions have been cycled more than others-and use this information to improve the reliability of the block by adjusting program voltages and verify voltage based on the cycle count.

Figure 1:
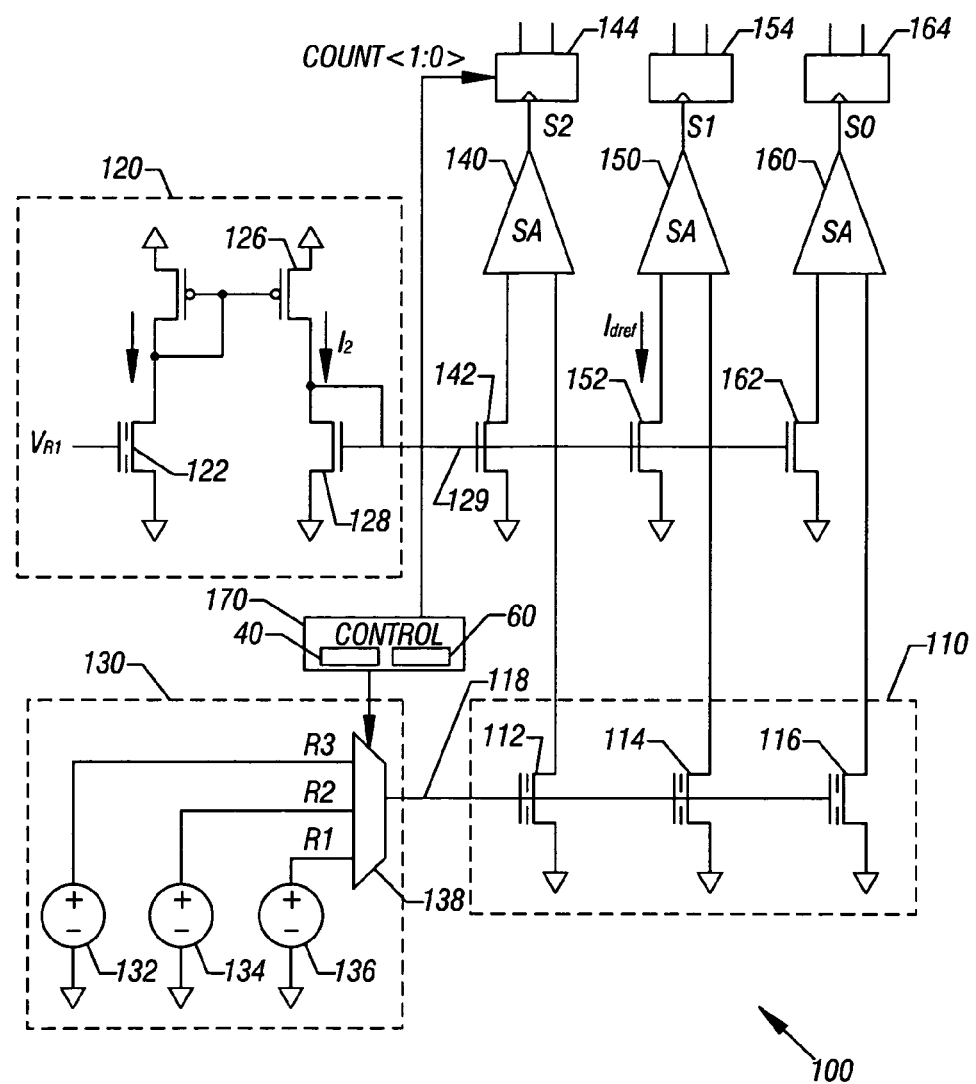
FIG. 1 shows a multi-level cell memory device.

FIG. 1 shows a multi-level cell memory device, such as a flash memory. Memory device 100 includes memory array 110, reference current generator 120, stepped voltage generator 130, sense amplifiers 140, 150, and 160, current mirror transistors 142, 152, and 162, latches 144, 154, and 164, and control circuit 170.

Memory array 110 includes multi-level cell transistors 112, 114, and 116 having gate nodes coupled to wordline 118. Transistors 112, 114, and 116, capable of storing multiple bits of information, may be "programmed" to have different threshold voltages. For example, the transistors 112, 114, and 116 may be "FLASH" cells that have floating gates capable of storing charge. The threshold voltage of a programmed flash cell depends in part on the amount of charge stored on the floating gate. By varying the amount of charged stored, transistors 112, 114, and 116 may be programmed to one of many different levels. For example, transistors 112, 114, and 116 may each be programmed to one of four levels to effectively store two bits of information in each memory cell.

Although this description focuses on embodiments in which each multi-level cell is programmed to one of four levels, the various embodiments of the invention are not so limited to any particular architecture or, for that matter, to multi-level memories. For example, in some embodiments of the present invention, each multi-level cell may be programmed to one of eight levels or one of 16 levels. While a flash memory is described, the memory may alternately be a phase change memory that uses a chalcogenide material or any of a variety of non-volatile memories including bit alterable and non-bit alterable or block erased memories.

For simplicity, FIG. 1 shows one row of cells in the array 110. In some embodiments, the array includes many rows and columns of cells. Further, in some embodiments, arrays are arranged in blocks, and many blocks are included within memory device 100. The memory array may include planes that, in one embodiment, include 16 blocks of cells. A partition includes two planes, in one embodiment. Memory device 100 may be any size with any hierarchical arrangement without departing from the scope of the present invention.

The cell state may be determined by performing multiple comparisons of the cell drain current to a fixed reference current where the cell gate voltage is varied for each comparison. For an N-state memory, N-1 comparisons with N-1 gate voltage values are used to uniquely determine the cell state.

Stepped voltage generator 130 sources the N-1 gate voltage values, where N is equal to 4 in one embodiment. The N-1 gate voltage values may be fixed and generated using ideal on-chip voltage reference circuits 132, 134, and 136, which may be independent of environmental conditions. A timing control circuit 170 may generate control signals to control multiplexer 138. Multiplexer 138 selects one of the N-1 gate voltage values to be applied to the wordline. In some embodiments, the gate voltage sequences from high values to low values (step down). In other embodiments, the gate voltage sequences from low to high (step up). In still further embodiments, the sequence of gate voltages is arbitrary. For example, for a multi-level cell having four possible states, the gate may be driven with three voltage values in sequence starting with the center value, then proceeding to the low value, and then the high value.

In spiral sensing, the wordline is pre-charged to the high level. The voltage is allowed to fall to the center value which is sensed first, followed by the low value, and then the high value. By going to the center value first, more gate drive is applied to the devices in the word line path, allowing faster transitions. Also, the center level may be read first to determine if the data stored in the selected row is single bit or multilevel data. If it is single bit data, the transition to the single bit level may be faster compared to starting with the low level.

Sense amplifiers 140, 150, and 160 compare currents in array cells to a reference current. For example, sense amplifier 140 may compare a drain current in transistor 112 to a reference drain current in transistor 142. The output of the sense amplifier is a digital signal representing the result of the comparison. This comparison result is converted to a binary representation of the cell state by logically combining the comparison result with a digital count that represents the cell state being compared against.

Various methods can be used to perform this state determination. In some embodiments, one or several latches are coupled to each amplifier to latch the state value. An example embodiment is shown in FIG. 1 with latches 144, 154, and 164 receiving a "count" value from control circuit 170, and a clock signal from the associated sense amplifier. When the sense amplifier output changes state, the count value that represents the cell state is latched.

As shown in FIG. 1, multiple sense amplifiers are included, where each sense amplifier is connected to a unique bitline. This allows many cells to be read simultaneously to increase the data throughput. All cells being read may simultaneously receive a common gate voltage applied through the wordline.

For program and erase operations, it may be desirable to position the cell levels halfway between the state boundaries used for read. This can provide high reliability for subsequent read operations. This state positioning may be accomplished by incorporating a special read mode, called verify mode, into the program and erase operations. This mode may be used to verify that the cell state is correctly positioned. The verify mode gate voltage values are intentionally offset from the read mode voltages to achieve the desired state positioning. It may also be desirable for verify mode to use the same gate voltage timing and sequence as used during read mode so that transient offsets in the gate path will be common to both verify and read, thus being cancelled.

Reference current generator 120 includes reference cell 122, which in some embodiments, is identical to array cells. For example, reference cell 122 may be identical to cell transistors 112, 114, and 116. The threshold voltage values of reference cell 122 may be adjusted during manufacturing or testing to achieve the desired nominal reference current. The gate voltage of the reference cell can be ideal (independent of environment). In some embodiments, a separate reference current generator 120 is provided for each sense amplifier.

In embodiments represented by FIG. 1, a current mirror is used to propagate the current of a single reference cell to each of the sense amplifiers. For example, the current in reference cell 122 ($I_1$) is mirrored to transistors 126 and 128 as $I_2$, which is in turn mirrored to transistors 142, 152, and 162 as $I_{dref}$. Transistor scaling techniques may be employed to provide fixed relationships between currents I, $I_2$, and $I_{dref}$.

In some embodiments, reference cell 122 is replaced by many cells whose drain currents are averaged to generate a current of an average reference cell. Also in some embodiments, the mirror gate voltage on node 129 is sampled and held on a large capacitor allowing the reference current generator to be turned off most of the time.

In embodiments having a temperature independent gate voltage on reference cell 122, the reference cell current is temperature-dependent due to the inherent temperature dependency of the cell. The reference current temperature dependency matches the temperature dependency of the main array cell which is also receiving a temperature independent gate voltage. This temperature tracking behavior ensures that the state difference obtained during verify is preserved during read, even if the temperature changes between verify and read operations.

Figure 2:
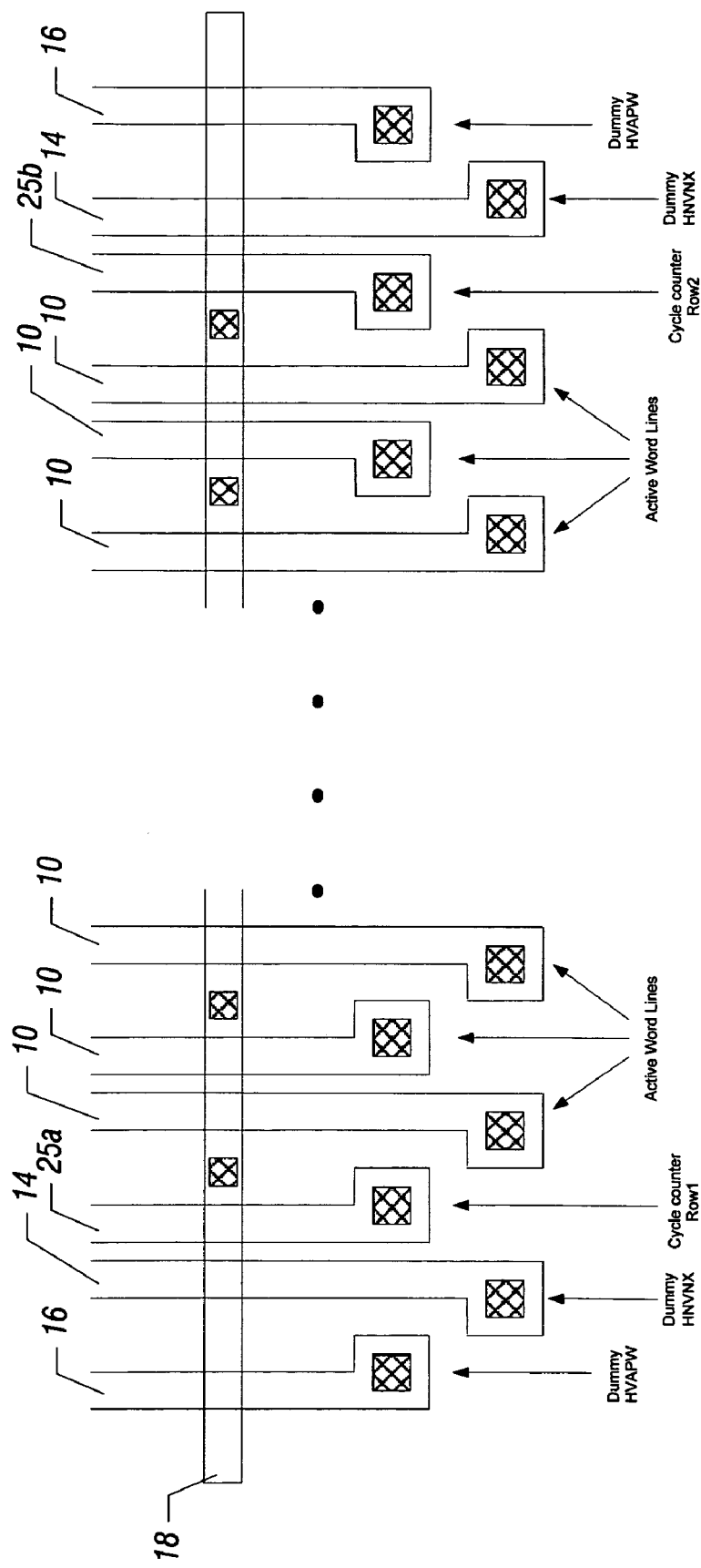
FIG. 2 is a partial top view of the row architecture per block.

Referring to FIG. 2, the architecture of each block includes active wordlines 10, a column line 18, erase cycle count rows 25a and 25b (not all of which are shown), for purposes of counting the number of erase cycles that the active wordlines 10 encounter, and pairs of dummy row lines 14 and 16. The dummy HVAPW wordline is the outermost dummy wordline. Its dummy transistor (not shown) provides uniform flash cell processing. The dummy HVAPW wordline is connected to HHVAPW to bias the wordline to a known voltage equivalent to the P-well of the flash cell array. The dummy HNVNX wordline is the innermost dummy and is also used to provide uniform processing of flash cells. However, HHVNX is different from HHVAPW in that it goes negative when the flash array block is erased while HHVAPW goes positive during erase. The dummy wordlines 14 and 16 provide reference levels. In some embodiments, a large number of active wordlines 10, such as all the active wordlines of one memory block, may be associated with the cycle counter row lines 25a and 25b.

Figure 3:
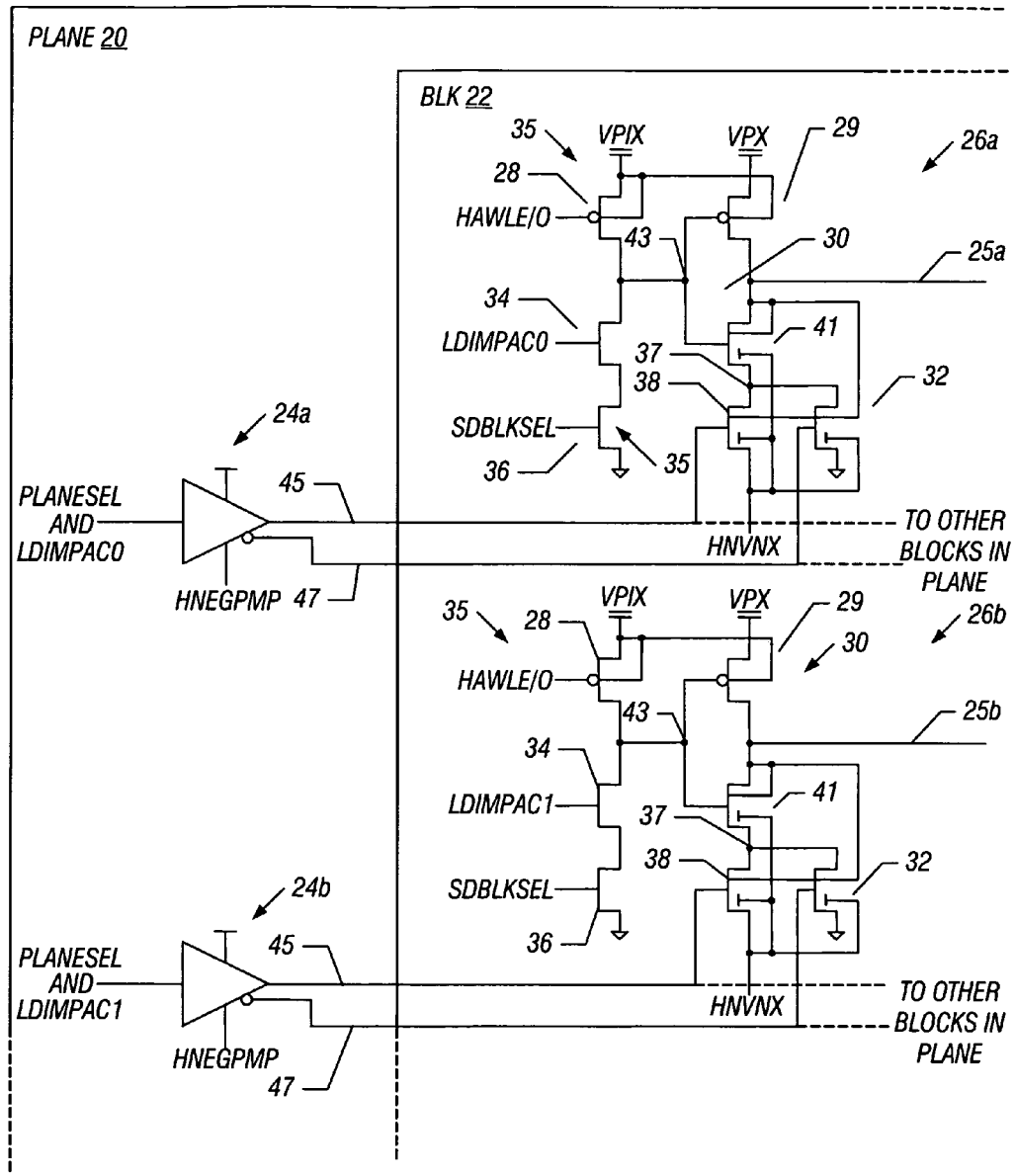
FIG. 3 shows a portion of an x-decoder coupled between a stepped voltage generator and a wordline.

Referring next to FIG. 3, the memory drive 100 may include a plurality of planes 20, in turn, broken into a number of blocks 22. The plane select signal PLANESEL and wordline select signal LDINPACO may be provided to a negative level shifter 24 that passes positive or negative high voltages based on the digital inputs. The level shifter 24 receives a signal HNEGPMP, which is a plane level high voltage signal, that goes negative to erase the selected wordline. Connected to the level shifter 24 are a pair of cycle counter wordlines 25a and 25b. One cycle level wordline 25a is coupled to a triple well transistor 38 used to select and deselect that wordline. The other cycle counter wordline 25b is coupled to a triple well transistor 32 used to select and deselect that wordline.

The transistors 32 and 38 are coupled to an inverter 30, in turn, coupled to the wordline 10. The circuit 26 also includes a pair of P-type transistors 28 and 29. The transistor 29, which makes up part of the inverter 30, is coupled to VPX and the transistor 28 is coupled to VPIX. VPX and VPIX are block level signals that are passed to selected wordlines.

A NAND gate 35 includes the transistors 28, 34, and 36. The transistor 28 is coupled to the signal HAWLE/O, which is a plane level signal that is a voltage reference used to make the p-device linear resistance less than the linear resistance of the series combination of the transistors 34 and 36. The transistor 28 may also be called a ratio level shifter that transfers a digital input signal to a high voltage output signal. It may do this by developing the ratio of resistances such that the ratio level shifter switches with high voltage on the source of the p-device. The size of this ratio is determined by the power and speed requirements. Thus, the cycle counter wordlines 25a and 25b may be selected and may be alternately erased under the control of the level shifter 24 and the triple well transistors 38 and 32.

The negative level shifter 24 passes HNEGPMP onto the gates of the one triple well transistors 32 or 38 for the deselected cycle counter wordline (either 25a or 25b). While doing this the other triple well transistor 38 or 32 has the supply voltage on its gate to bias an internal triple well node 37 to ground or $V_{ss}$. This prevents a negative voltage from passing onto the deselected cycle counter wordline 25a or 25b and prevents the data on that deselected wordline from being erased.

The negative level shifter 24 may be used in a higher read while write partition to prevent a negative voltage from getting to the last valid cycle count and erase states. This decoding and row architecture maintains a valid cycle count and erase algorithm status data. The architecture also enables control of a valid cycle count by writing the progress of the erase algorithm and cycle count into a non-volatile memory location.

Thus, there are two non-volatile memory locations that are unique to the erase partition or memory block. One location always maintains the cycle count of all the state bits except the cycle count write complete bit. This last bit is stored in the other non-volatile memory location. The two non-volatile memory locations are alternately erased with the block. The ability to erase of only one location is achieved by preventing the wordline of that memory row from staying grounded. This erased memory location contains the new cycle count data and three of the four state bits. The memory location to be erased contains the cycle count write complete bit if an erase and cycle count was completed successively.

A power loss recovery routine restores the valid cycle count by determining the power loss state and executing the power loss recovery location. For example, if power was lost after updating the count, the routine is able to detect that power was lost in that state and resume the count update at that point. This ensures a valid cycle count by knowing which non-volatile memory location is correct so that the correct data can be updated before executing the erase command.

FIG. 3 shows two erase cycle counter wordlines 25a and 25b coupled to decoders 26a and 26b respectively. The active wordlines 10 are not shown. Only one block is shown. A pre-decoder receives address signals and drives signals at the input to NAND gate 35. When an erase cycle counter wordline 25 is to be selected, a NAND gate 35 drives a low voltage on node 43 which drives output buffer 30. Output buffer 30 receives a voltage Vpx on a power supply node. Accordingly, when a wordline 25a or 25b is selected, the power supply node voltage Vpx is driven onto wordline 25a or 25b. The output buffer 30 includes an inverter pair including P-device 29 and N-device 41.

The circuits 26a and 26b operate to alternately erase the wordlines 25a and 25b. One level shifter 24a or 24b turns off two triple well transistors 32 and 38 by applying a negative voltage to their gates. The negative voltage from HNEGPMP is used for this purpose. As a result, the corresponding wordline 25a or 25b is erased by HNVNX because triple well transistor 41 is on and passes the negative voltage to a wordline 25a or 25b.

The other level shifter 24b or 24a turns the other wordline 25b or 25a on which can be read or programmed by the NAND gate 35. The negative voltage HNVNX is blocked from the wordline 25b or 25a by the supply voltage gate bias supplied by the level shifter 24b or 24a. The supply voltage bias biases the internal triple well transistor 41 node 37 to $V_{ss}$ or ground. This results in turning off the internal triple well transistor 41. As a result the wordline 25b or 25a is isolated from the negative voltage HNVNX and is not erased.

In the next cycle the signals switch so that the wordline 25a or 25b that was programmed in the previous cycle is erased and the previously erased wordline is programmed.

In some embodiments, a relatively small die area may be used to implement the counter architecture. This implementation also allows the existing flash block partition to increase, while sharing all of the y-decoding and sensing circuits to read and write the cycling data. The two non-volatile memory rows, along with decoding, allow for power loss recovery and provides a robust design to maintain cycling data and reliability results. The two non-volatile memory rows maintain programming erase times because they maintain the same architecture as is currently used for customer programming and erase.

In accordance with one embodiment of the present invention, a cycle counting method is provided in which one of the cycle counting wordlines 25a or 25b maintains the cycle count and all of the state bits except for the cycle count write complete bit. The cycle count write complete bit is stored in the other wordline 25a or 25b. The two non-volatile memory locations are alternately erased with their respective blocks in a block erased embodiment. The erased cycle count memory location is used to store the new cycle count data and three of the four state bits. The memory location to be erased contains the cycle count write complete bit if an erase and cycle count were completed successfully.

Figure 4:
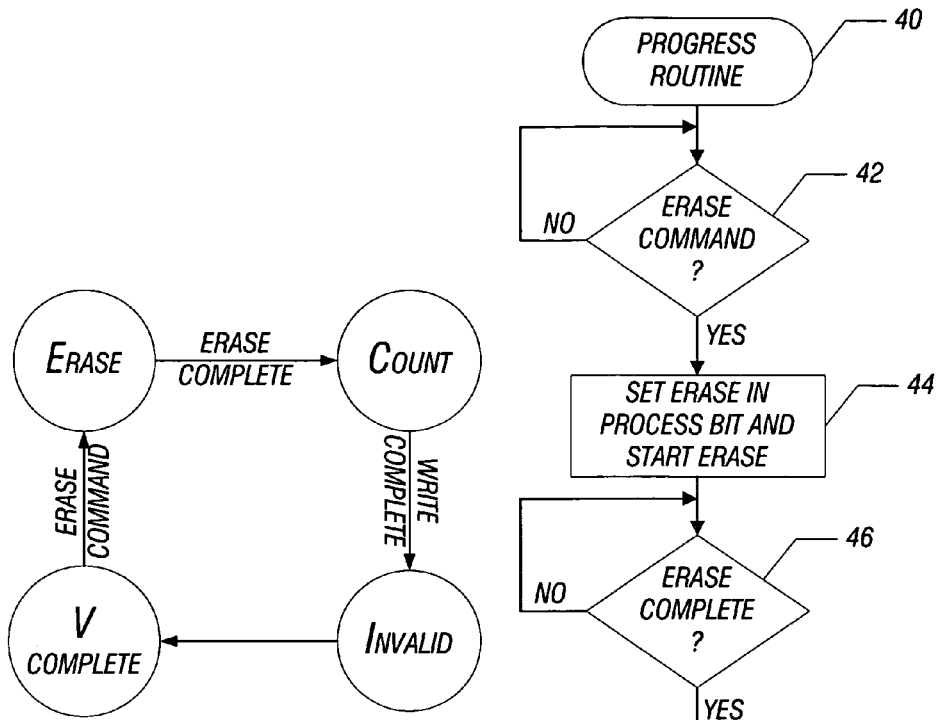
FIG. 4 is a state diagram for the cycle counting method.

A cycle count method, for one embodiment, is illustrated by the state diagram in FIG. 4. If, initially, the current state is V, which means that the count update is complete, the next state for that memory location would be E or erase-in-process. The transition occurs in response to the erase command.

From the erase-in-process state E, when the erase is complete, the next state is C or updating count. From the C or updating count state, upon write completion, that memory location transitions to the state I or count invalid. From the I or count invalid state, the state transitions back to V, count update complete.

When the current state is count update complete (V), the persistent memory value on one of the wordlines 25a or 25b is set to an erase-in-process bit. Once the erase is complete, the updating count bit is set. Then, when the write is complete, the count update complete bit is set and the copy count is set. The copy count is the cycle count data that is programmed into the other cycle count location (e.g., 25b if the cycle count was previously stored at 25a) before erasing the old cycle count data. Thus, the new cycle count is n+1 more than the old cycle count. The old cycle count data location is erased after the new cycle count data is written to the new location.

Thereafter, the count invalid bit is set for the now erased location after the copy count has been written into the new memory location on a different wordline 25a or 25b.

Figure 5:
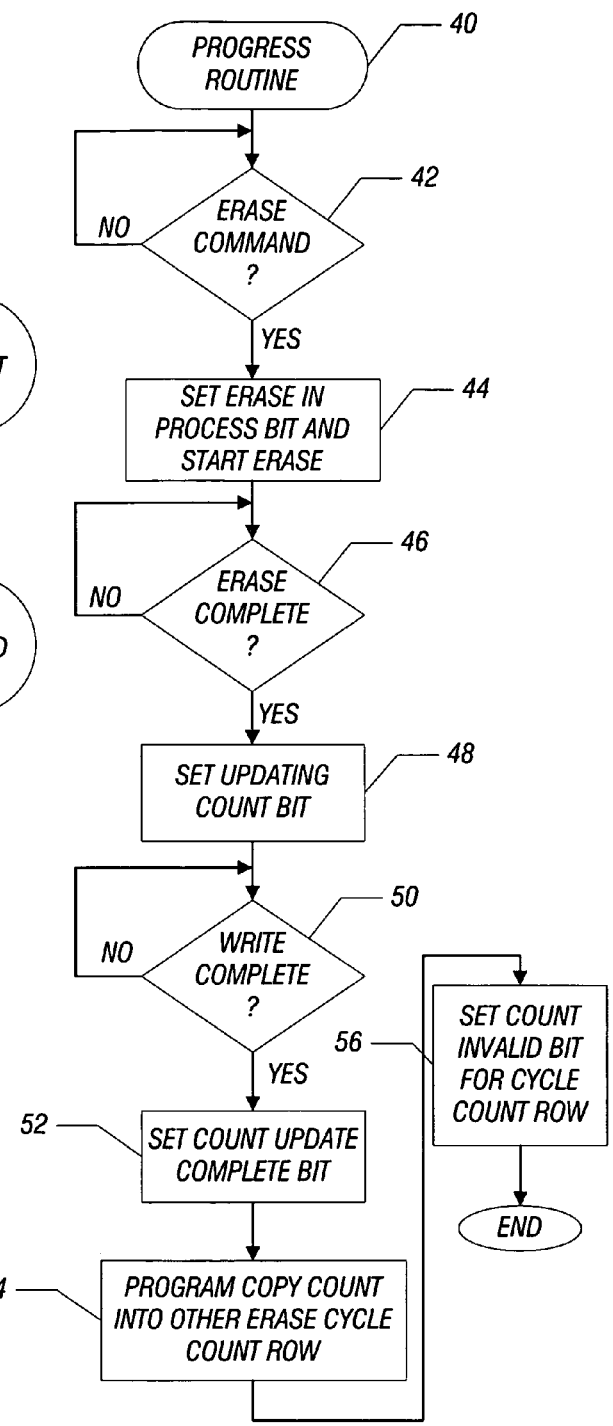
FIG. 5 is a flow diagram for the cycle counting method.

Thus, referring to FIG. 5, a method for implementing the cycle counting is illustrated for one embodiment. In some embodiments, the progress routine 40 may be implemented in software, hardware, or firmware. In one embodiment, the cycle progress routine 40 may be stored in a memory 40, which is part of the control 170, shown in FIG. 1. However, the routine 40, implemented in software, may be stored on any magnetic or semiconductor memory, separate or part of the control 170.

Initially, a check at diamond 42 determines whether an erase command has been received. If so, the erase-in-process bit is set at one location, such as wordline 25a, and the erase is started, as indicated in block 44. When the erase is complete, as determined in diamond 46, the updating count bit is set, as indicated in block 48 on the same wordline, such as wordline 25a.

A check at diamond 50 determines when the write is complete. When the write is complete, the count update complete bit is set, as indicated in block 52, again on the same wordline, such as wordline 25a. Then, the copy count is programmed into the other erase cycle count wordline (e.g., wordline 25b), as indicated in block 54. The count invalid bit is set for the cycle count wordline, such as wordline 25a in this example, as indicated in block 56. Thus, one wordline 25 is set invalid and the new wordline 25 has the copy count updated and programmed into it.

One problem that arises is that a power loss may occur in the memory in the course of setting the cycle count. If the cycle count is such that the two memory locations are in the count update complete and count invalid states, no problem exists. Accurate cycle count data has been retained in one of the memory locations. But a variety of other circumstances could also exist at the time of power loss. These create indeterminate states and require correction.

Thus, in some embodiments, after a power loss has been detected and the memory restarted, a power loss recovery routine may be implemented. In this power loss recovery routine, the erase status may be obtained initially. If the erase status is such that the two memory locations (i.e. wordlines 25a and 25b) are in the count invalid and count update complete states, then no power loss recovery is needed because the accurate count has been preserved through the power loss.

Otherwise, corrective action is taken. For example, if the erase status is dirty because the cycle counting wordlines 25 are in improper states, the erase must be restarted. For example, one cycle count wordline may be in the erase-in-process state with a count of n+1 and the second cycle count or row may be in a count invalid state with a count of n. This is an impossible situation and requires that the erase be restarted.

Another possibility is that the erase status after power loss is that the erase has been started and one of the cycle count wordlines 25 has indeterminable data on it. In response, the erase is restarted. Still another possibility is that that a cycle count wordline has determinable data on it, but the other cycle count wordline is in the state erase-in-process. Again, the result is the same and the erase is restarted as the power loss recovery routine. Still another possibility is that one of the cycle count wordlines is in the state, updating count. Regardless of what state the other cycle count wordline is in, the erase is restarted.

Figure 6:
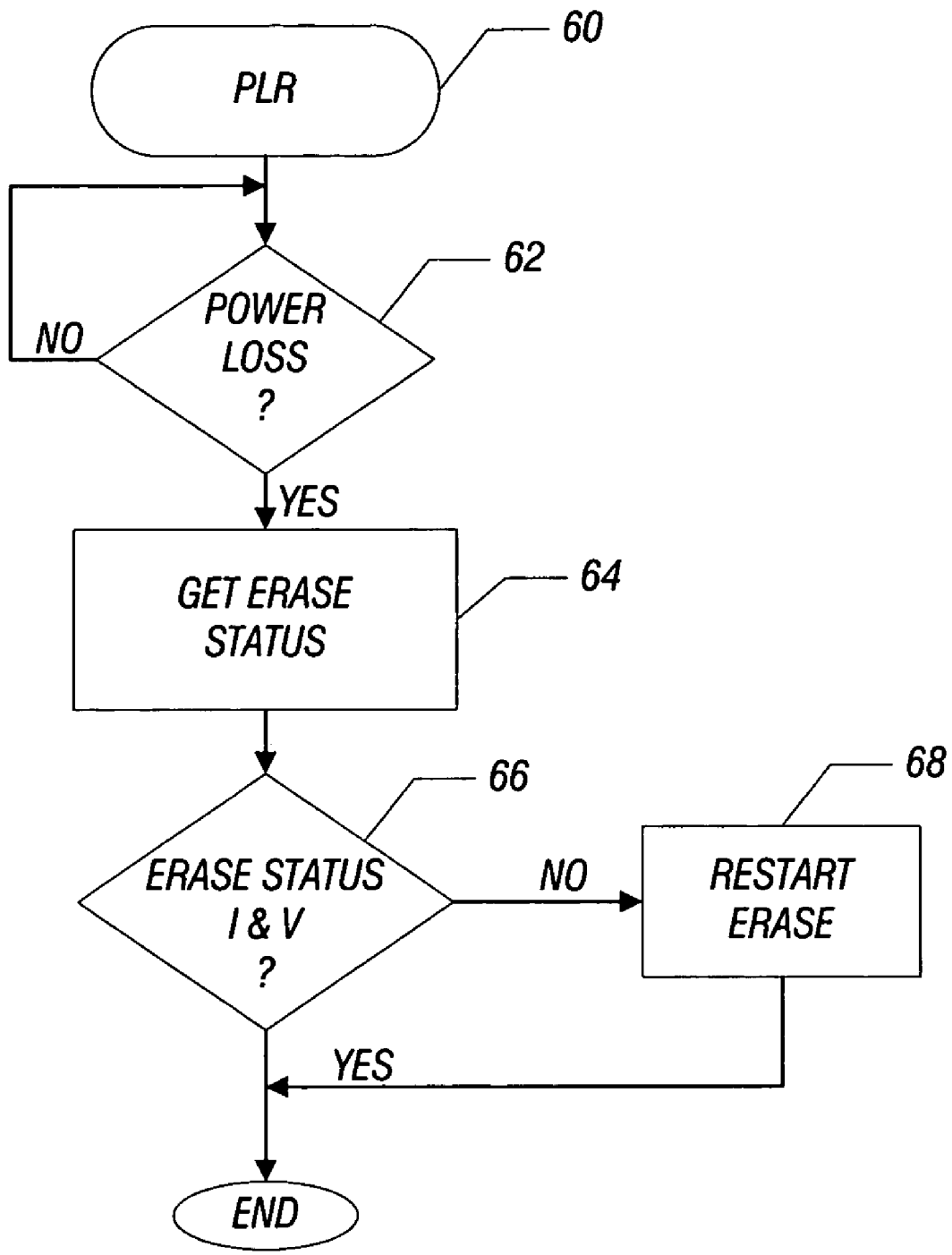
FIG. 6 is a flow diagram for the power loss recovery method.

Thus, referring to FIG. 6, a power loss recovery (PLR) method 60 may be implemented in software, hardware, or firmware. In one embodiment, the power loss recovery method 60 may be software which is stored in a memory. In one embodiment, that memory may be part of the control 170, as indicated in FIG. 1. However, in embodiments in which the methods 40 and 60 are software, they may be stored in any semiconductor or magnetic memory, which may be part of the control 170 or separate therefrom.

Initially, the method 60 determines whether a power loss occurred, as indicated in diamond 62. Conventional memories may have a power loss detector which indicates when a power loss occurred. It may simply be a bit that is reset when operations are completed or which is set when power is lost to the system. Those skilled in the art will appreciate a variety of other power loss detection techniques.

If a power loss has been detected, the erase status is obtained, as indicated in block 64. This basically means that the two erase count wordline memory locations are read.

Then, a check at diamond 66 determines the erase status of the two memory locations. If the memory locations are only in the count invalid and count update complete states, then no power loss recovery of the erase cycle count is necessary and the data may be used without further action. Otherwise, the erase is restarted, as indicated in block 68. Once the erase is completed, the cycle count will be in an accurate state again and the flow can continue. Basically, unless the last used memory location has been set invalid and the next used memory location has received the transfer of the cycle count, it is simply necessary to complete another erase cycle to set the system back at the correct count.

Figure 7:
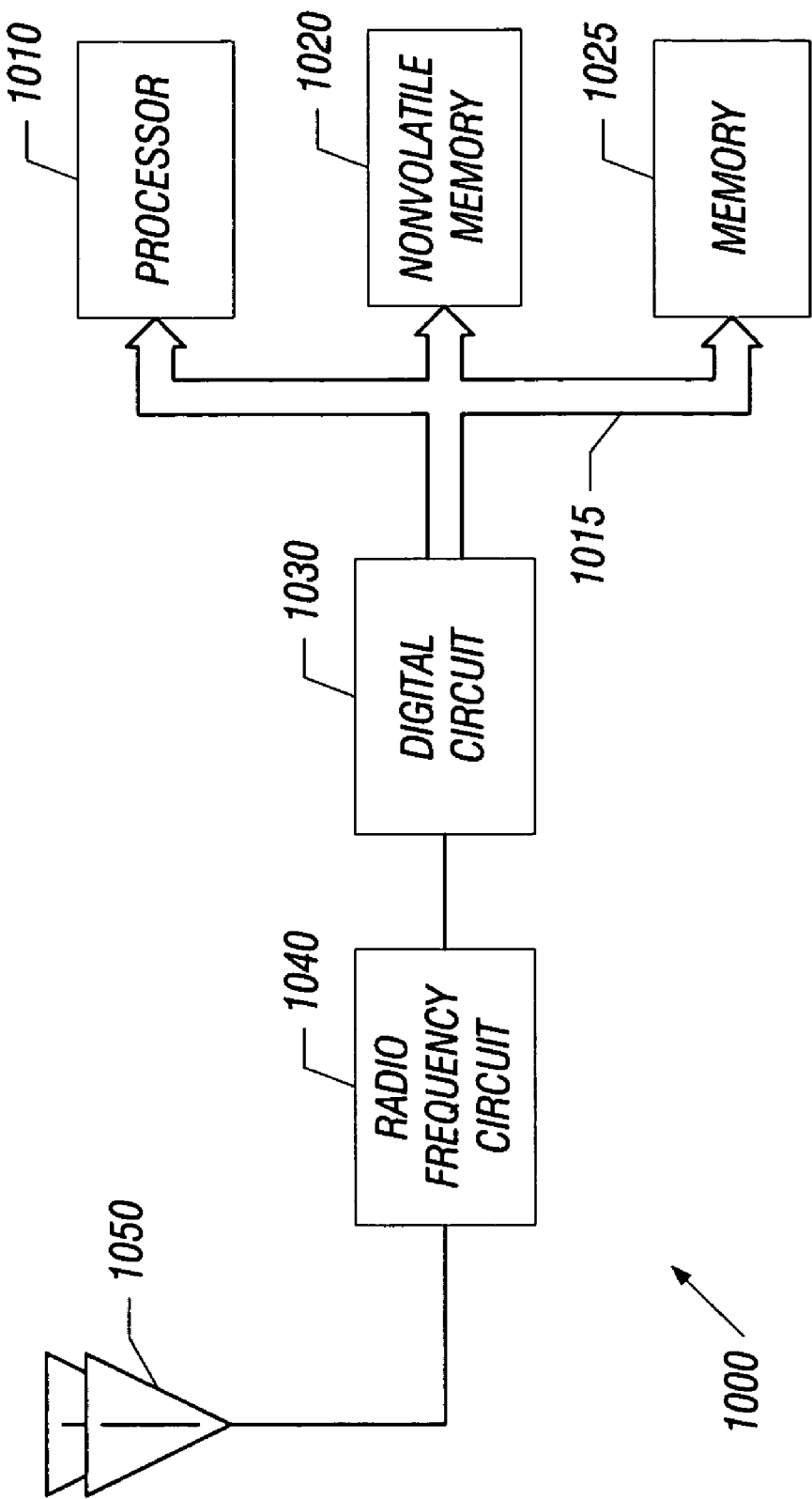
FIG. 7 shows an electronic system in accordance with various embodiments of the present invention.

FIG. 7 shows an electronic system in accordance with various embodiments of the present invention. Electronic system 1000 includes processor 1010, nonvolatile memory 1020, memory 1025, digital circuit 1030, radio frequency (RF) circuit 1040, and antennas 1050. Processor 1010 may be any type of processor adapted to access nonvolatile memory 1020 and memory 1025. For example, processor 1010 may be a microprocessor, a digital signal processor, a microcontroller, or the like.

Example systems represented by FIG. 7 include cellular phones, personal digital assistants, wireless local area network interfaces, or any other suitable system. Nonvolatile memory 1020 may be adapted to hold information for system 1000. For example, nonvolatile memory 1020 may hold device configuration data, such as contact information with phone numbers, or settings for digital circuit 1030 or RF circuit 1040. Further, nonvolatile memory 1020 may hold multimedia files such as photographs or music files. Still further, nonvolatile memory 1020 may hold program code to be executed by processor 1010. Nonvolatile memory 1020 may be any of the memory embodiments described herein, including memory device 100 (FIG. 1). Many other systems uses for nonvolatile memory 1020 exist. For example, nonvolatile memory 1020 may be used in a desktop computer, a network bridge or router, or any other system without an antenna.

Radio frequency circuit 1040 communicates with antennas 1050 and digital circuit 1030. In some embodiments, RF circuit 1040 includes a physical interface (PHY) corresponding to a communications protocol. For example, RF circuit 1040 may include modulators, demodulators, mixers, frequency synthesizers, low noise amplifiers, power amplifiers, and the like. In some embodiments, RF circuit 1040 may include a heterodyne receiver, and in other embodiments, RF circuit 1040 may include a direct conversion receiver. In some embodiments, RF circuit 1040 may include multiple receivers. For example, in embodiments with multiple antennas 1050, each antenna may be coupled to a corresponding receiver. In operation, RF circuit 1040 receives communications signals from antennas 1050, and provides signals to digital circuit 1030. Further, digital circuit 1030 may provide signals to RF circuit 1040, which operates on the signals and then transmits them to antennas 1050.

Digital circuit 1030 is coupled to communicate with processor 1010 and RF circuit 1040. In some embodiments, digital circuit 1030 includes circuitry to perform error detection/correction, interleaving, coding/decoding, or the like. Also in some embodiments, digital circuit 1030 may implement all or a portion of a media access control (MAC) layer of a communications protocol. In some embodiments, a MAC layer implementation may be distributed between processor 1010 and digital circuit 1030.

Radio frequency circuit 1040 may be adapted to receive and demodulate signals of various formats and at various frequencies. For example, RF circuit 1040 may be adapted to receive time domain multiple access (TDMA) signals, code domain multiple access (CDMA) signals, global system for mobile communications (GSM) signals, orthogonal frequency division multiplexing (OFDM) signals, multiple-input-multiple-output (MIMO) signals, spatial-division multiple access (SDMA) signals, or any other type of communications signals. The present invention is not limited in this regard.

Antennas 1050 may include one or more antennas. For example, antennas 1050 may include a single directional antenna or an omni-directional antenna. As used herein, the term omni-directional antenna refers to any antenna having a substantially uniform pattern in at least one plane. For example, in some embodiments, antennas 1050 may include a single omni-directional antenna such as a dipole antenna, or a quarter wave antenna. Also for example, in some embodiments, antennas 1050 may include a single directional antenna such as a parabolic dish antenna or a Yagi antenna. In still further embodiments, antennas 1050 may include multiple physical antennas. For example, in some embodiments, multiple antennas are utilized to support multiple-input-multiple-output (MIMO) processing or spatial-division multiple access (SDMA) processing.

Memory 1025 represents an article that includes a machine readable medium. For example, memory 1025 represents a random access memory (RAM), dynamic random access memory (DRAM), static random access memory (SRAM), read only memory (ROM), flash memory, or any other type of article that includes a medium readable by processor 1010. Memory 1025 may store instructions for performing the execution of the various method embodiments of the present invention.

In operation, processor 1010 reads instructions and data from either or both of nonvolatile memory 1020 and memory 1025 and performs actions in response thereto. For example, processor 1010 may access instructions from memory 1025 and program threshold voltages within reference voltage generators and reference current generators inside nonvolatile memory 1020. In some embodiments, nonvolatile memory 1020 and memory 1025 are combined into a single memory device. For example, nonvolatile memory 1020 and memory 1025 may both be included in a single nonvolatile memory device.

Although the various elements of system 1000 are shown separating in FIG. 7, embodiments exist that combine the circuitry of processor 1010, nonvolatile memory 1020, memory 1025 and digital circuit 1030 in a single integrated circuit. For example, memory 1025 or nonvolatile memory 1020 may be an internal memory within processor 1010 or may be a microprogram control store within processor 1010. In some embodiments, the various elements of system 1000 may be separately packaged and mounted on a common circuit board. In other embodiments, the various elements are separate integrated circuit dice packaged together, such as in a multi-chip module, and in still further embodiments, various elements are on the same integrated circuit die.

The type of interconnection between processor 1010 and nonvolatile memory 1020 is not a limitation of the present invention. For example, bus 1015 may be a serial interface, a test interface, a parallel interface, or any other type of interface capable of transferring command and status information between processor 1010, nonvolatile memory 1020, and memory 1025.

Step voltage generators, voltage references, flash cells, feedback circuits, x-decoders, control circuits, and other embodiments of the present invention can be implemented in many ways. In some embodiments, they are implemented in integrated circuits. In some embodiments, design descriptions of the various embodiments of the present invention are included in libraries that enable designers to include them in custom or semi-custom designs. For example, any of the disclosed embodiments can be implemented in a synthesizable hardware design language, such as VHDL or Verilog, and distributed to designers for inclusion in standard cell designs, gate arrays, or the like. Likewise, any embodiment of the present invention can also be represented as a hard macro targeted to a specific manufacturing process. For example, memory array 110 (FIG. 1) can be represented as polygons assigned to layers of an integrated circuit.

References throughout this specification to "one embodiment" or "an embodiment" mean that a particular feature, structure, or characteristic described in connection with the embodiment is included in at least one implementation encompassed within the present invention. Thus, appearances of the phrase "one embodiment" or "in an embodiment" are not necessarily referring to the same embodiment. Furthermore, the particular features, structures, or characteristics may be instituted in other suitable forms other than the particular embodiment illustrated and all such forms may be encompassed within the claims of the present application.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
    storing information about erase cycles in a non-volatile memory on two different rows;
    erasing said rows on alternating erase cycles; and
    detecting that a power loss has occurred after erasing said rows on alternating erase cycles.

2. The method of claim 1 including storing an erase cycle write complete bit on one of said rows and storing other information on the other of said rows.

3. The method of claim 1 wherein erasing includes providing a negative voltage to one of said rows and not the other.

4. The method of claim 1 including providing two rows to store erase cycle information in each block of the memory.

5. The method of claim 1 including storing erase cycle information for a flash memory.

6. The method of claim 1 including using triple well transistors to control the transfer of negative voltage to an erase cycle row to be erased.

7. The method of claim 6 including providing a negative level shifter to selectively provide a negative or a positive voltage, depending on whether a row is to be erased or not.

8. The method of claim 1. including, in response to the detection that a power loss has occurred, determining whether the information about the erase cycle is correct and, if not, restarting the erase operation to ensure that the erase information is accurate.

9. The method of claim 8 including determining whether the information in one of the rows is invalid and the erase information has been successfully updated on the other row.

10. A non-volatile memory comprising:
    an array including a plurality of memory cells arranged in array rows and columns;
    at least two additional rows to store information relating to an erase cycle count, said rows being erased on alternate erase cycles; and
    a control to, in response to the detection that a power loss has occurred, determine whether the additional rows store up-to-date information and, if not, restart an erase.

11. The memory of claim 10 including a negative level shifter to selectively provide a positive or a negative voltage, said negative voltage for an erase cycle row to be erased and said positive voltage for an erase cycle row not to be erased.

12. The memory of claim 11 including a pair of triple well transistors to receive the voltages from said negative level shifter and to selectively apply the voltages to the erase cycle rows.

13. The memory of claim 10 including two erase cycle rows for each memory block.

14. The memory of claim 13 including four dummy rows for each block.

15. The memory of claim 10 wherein said memory is a flash memory.

16. The memory of claim 10 including a control to determine whether one of the rows is invalid and the other of said rows has the up-to-date erase information.

17. The memory of claim 10 wherein said memory is block erasable.

18. A computer readable medium storing instructions that, when executed, cause a computer to:
    store information about erase cycles in a non-volatile memory on two different rows;
    erase said rows on alternating erase cycles; and
    store an erase cycle write complete bit on one of said rows and storing other information on the other of said rows.

19. The medium of claim 18 storing instructions to, in response to the detection that a power loss has occurred, determine whether the rows are in appropriate states and, if not, restart an erase operation.

20. The medium of claim 19 storing instructions to determine whether one of the rows has invalidated data and the other of said rows has successfully updated erase cycle count data.

21. A system comprising:
a processor;
a wireless interface coupled to said processor;
a non-volatile memory coupled to said processor, said non-volatile memory including an array including a plurality of memory cells arranged in rows and columns and at least two additional rows to store information relating to an erase cycle count, said rows being erased in alternately erase cycles; and
a negative level shifter to selectively provide a positive or a negative voltage, said negative voltage for an erase cycle row to be erased and said positive voltage for an erase cycle row not to be erased.

22. The system of claim 21 including a pair of triple well transistors to receive the voltages from said negative level shifter and to selectively apply the voltages to the erase cycle rows.

23. The system of claim 21 including two erase cycle rows for each memory block.

24. The system of claim 23 including four dummy rows for each block.

25. The system of claim 21 wherein said memory is block erasable.

26. The system of claim 21 wherein said memory is a flash memory.

* * * * *